(12) United States Patent
Oh et al.

(10) Patent No.: US 12,282,983 B2
(45) Date of Patent: Apr. 22, 2025

(54) STATIC ELECTRICITY VISUALIZATION SYSTEM

(71) Applicant: SEMES CO., LTD., Chungcheongnam-do (KR)

(72) Inventors: Jun Ho Oh, Gyeonggi-do (KR); Kwang Sup Kim, Chungcheongnam-do (KR); Jong Min Lee, Gyeonggi-do (KR); Yeon Chul Song, Seoul (KR); Young Ho Park, Incheon (KR); Ji Hoon Yoo, Gyeonggi-do (KR); Myeong Jun Lim, Gyeonggi-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 347 days.

(21) Appl. No.: 17/743,432

(22) Filed: May 12, 2022

(65) Prior Publication Data
US 2023/0116619 A1 Apr. 13, 2023

(30) Foreign Application Priority Data

Oct. 7, 2021 (KR) ........................ 10-2021-0132959

(51) Int. Cl.
*G06T 11/00* (2006.01)
*G01R 19/00* (2006.01)
(Continued)

(52) U.S. Cl.
CPC ........ *G06T 11/001* (2013.01); *G01R 19/0046* (2013.01); *G06T 7/73* (2017.01); *G06T 11/206* (2013.01); *G06T 2207/30204* (2013.01)

(58) Field of Classification Search
None
See application file for complete search history.

(56) References Cited

U.S. PATENT DOCUMENTS

| 2014/0375652 A1* | 12/2014 | Jeon | G06T 11/206 345/440 |
| 2018/0160324 A1* | 6/2018 | Tankielun | H04B 17/23 |

(Continued)

FOREIGN PATENT DOCUMENTS

| JP | 2013-124953 | | 6/2013 |
| KR | 20120052578 | * | 5/2012 |

(Continued)

*Primary Examiner* — Sarah Le
(74) *Attorney, Agent, or Firm* — WOMBLE BOND DICKINSON (US) LLP

(57) ABSTRACT

A static electricity visualization system capable of visually confirming the level of the measured static electricity is provided. The static electricity visualization system comprises a first measuring unit for measuring a static electricity level detected at a first position of a measurement target and comprising a first mark, a photographing unit for generating a photographed image by photographing the measurement target, a processor for recognizing a first mark in the photographed image and calculating coordinates of the first mark on the photographed image, and an output unit for outputting a static electricity visualization image that visualizes the static electricity level measured by the first measuring unit in a first mode, wherein the static electricity visualization image comprises a color corresponding to a level of static electricity measured by the first measuring unit on the coordinates of the first mark of the photographed image.

11 Claims, 8 Drawing Sheets

(51) Int. Cl.
   *G06T 7/73*      (2017.01)
   *G06T 11/20*     (2006.01)

(56) References Cited

U.S. PATENT DOCUMENTS

2020/0198327 A1\*   6/2020   Hauf ........................ B41J 3/407
2021/0304099 A1\*   9/2021   Gódor .............. G06Q 10/06315

FOREIGN PATENT DOCUMENTS

KR         10-1427598        8/2014
KR     10-2015-0000544       1/2015

\* cited by examiner

STATIC ELECTRICITY VISUALIZATION SYSTEM

This application claims the benefit of Korean Patent Application No. 10-2021-0132959, filed on Oct. 7, 2021, in the Korean Intellectual Property Office, the disclosure of which is incorporated herein by reference in its entirety.

BACKGROUND

1. Field

The present disclosure relates to a static electricity visualization system.

2. Description of the Related Art

Static electricity is formed when electric charges generated by electric charge are accumulated without being discharged due to the large resistance of the surface of the object, and this is one of the important problems to be solved in order to improve the yield in a semiconductor manufacturing process using a substrate, which is an insulator.

Static electricity, which is formed due to various reasons, is the main cause of particle defects by collecting particles on the substrate during the manufacturing process. When a discharge is generated due to static electricity, the potential of the static electricity has a level of several hundred or several thousand volts. A substrate, on which a highly integrated chip is formed, may be seriously affected by device destruction even by a charging potential of several tens of volts. Accordingly, there is an increased need to measure and control static electricity generated in the substrate processing apparatus.

SUMMARY

An object of the present disclosure is to provide a static electricity visualization system capable of visually confirming the level of the measured static electricity.

The objects of the present disclosure are not limited to the objects mentioned above, and other objects not mentioned will be clearly understood by those skilled in the art from the following description.

One aspect of the static electricity visualization system of the present disclosure for achieving the above object comprises a first measuring unit for measuring a static electricity level detected at a first position of a measurement target and comprising a first mark; a photographing unit for generating a photographed image by photographing the measurement target; a processor for recognizing a first mark in the photographed image and calculating coordinates of the first mark on the photographed image; and an output unit for outputting a static electricity visualization image that visualizes the static electricity level measured by the first measuring unit in a first mode, wherein the static electricity visualization image comprises a color corresponding to a level of static electricity measured by the first measuring unit on the coordinates of the first mark of the photographed image.

Wherein the processor receives the photographed image from the photographing unit, and receives the measured static electricity level from the measuring unit, and generates the static electricity visualization image, in which a color corresponding to the level of static electricity measured by the measuring unit is displayed on the coordinates of the mark of the photographed image.

The system further comprises a memory for storing color data corresponding to the level of static electricity measured by the measuring unit, wherein the processor generates the static electricity visualization image by using the color data stored in the memory.

Wherein the output unit, in a second mode, outputs a change in the static electricity level measured by the first measuring unit for a predetermined time as a graph.

Wherein the processor switches the first mode and the second mode of the output unit.

Wherein the first measuring unit transmits data of the measured static electricity level to the processor through wireless communication.

Wherein the first measuring unit is detachable from the first position of the measurement target.

Wherein the first measuring unit directly outputs the measured static electricity level as a numerical value.

The system further comprises a second measuring unit for measuring a static electricity level detected at a second position of the measurement target, and comprising a second mark, wherein the photographing unit recognizes the second mark, wherein the processor calculates coordinates of the second mark on the photographed image, wherein the first mark and the second mark are different in shape.

Another aspect of the static electricity visualization system of the present disclosure for achieving the above object comprises a first measuring unit installed at a first position of a measurement target for measuring a level of static electricity detected at the first position, and to which a first mark is attached; a photographing unit for photographing the measurement target, on which the first measuring unit is installed; a processor for calculating coordinates of the first mark on a photographed image of photographing the measurement target, and generating a visualization image, in which a first color corresponding to a level of static electricity measured by the first measuring unit is displayed on coordinates of the first mark; and an output unit for outputting the visualization image generated by the processor in a first mode, wherein the processor receives a photographed image of photographing the measurement target from the photographing unit, and receives a level of static electricity measured at the first position from the first measuring unit through wireless communication.

The system further comprises a second measuring unit installed in a second position different from the first position of the measurement target for measuring a level of static electricity detected at the second position, and to which a second mark is attached, wherein the processor calculates coordinates of the second mark on the photographed image, wherein the visualization image displays a second color corresponding to a level of static electricity measured by the second measuring unit different from a level of static electricity measured by the first measuring unit on coordinates of the second mark, wherein the first color and the second color are different.

Wherein the first mark and the second mark are different in shape.

Wherein the first measuring unit comprises a display unit for directly outputting a level of static electricity measured at the first position as a numerical value.

Wherein the first mark is detachable from the first measuring unit.

The system further comprises a memory for storing static electricity level data measured by the first measuring unit.

The system further comprises a memory for storing a plurality of color charts comprising color data corresponding to a level of static electricity measured by the first measuring unit, wherein the processor selects one color chart from among the plurality of color charts stored in the memory, wherein the processor matches a level of static electricity measured by the first measuring unit and the first color corresponding thereto in the one color chart, and displays the first color on coordinates of the first mark.

Wherein the output unit outputs, in a second mode, a change in the level of static electricity measured by the measuring unit for a predetermined time as a graph.

Wherein the processor, according to an external request, switches the first mode and the second mode of the output unit.

Another aspect of the static electricity visualization system of the present disclosure for achieving the above object comprises a first measuring unit installed at a first position of a measurement target for measuring a level of static electricity detected at the first position, and to which a first mark is attached; a photographing unit for photographing the measurement target, on which the first measuring unit is installed; a memory for storing a plurality of color charts comprising color data corresponding to a level of static electricity; a processor for generating a visualization image, in which a first color corresponding to a level of static electricity measured by the first measuring unit is displayed on coordinates of the first mark; and an output unit for outputting the visualization image generated by the processor in a first mode, wherein the processor receives a photographed image of photographing the measurement target from the photographing unit, and receives a level of static electricity measured at the first position from the first measuring unit through wireless communication, wherein the processor calculates coordinates of the first mark on the photographed image, and selects one color chart from among a plurality of color charts stored in the memory, wherein the processor determines, in the selected one color chart, a color corresponding to a level of static electricity measured by the first measuring unit, wherein the processor generates the visualization image by displaying the determined color on the coordinates of the first mark.

Wherein the output unit, in response to the processor switching the output unit to a second mode, output a change in the level of the static electricity measured by the first measuring unit for a predetermined time as a graph.

The details of other embodiments are comprised in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
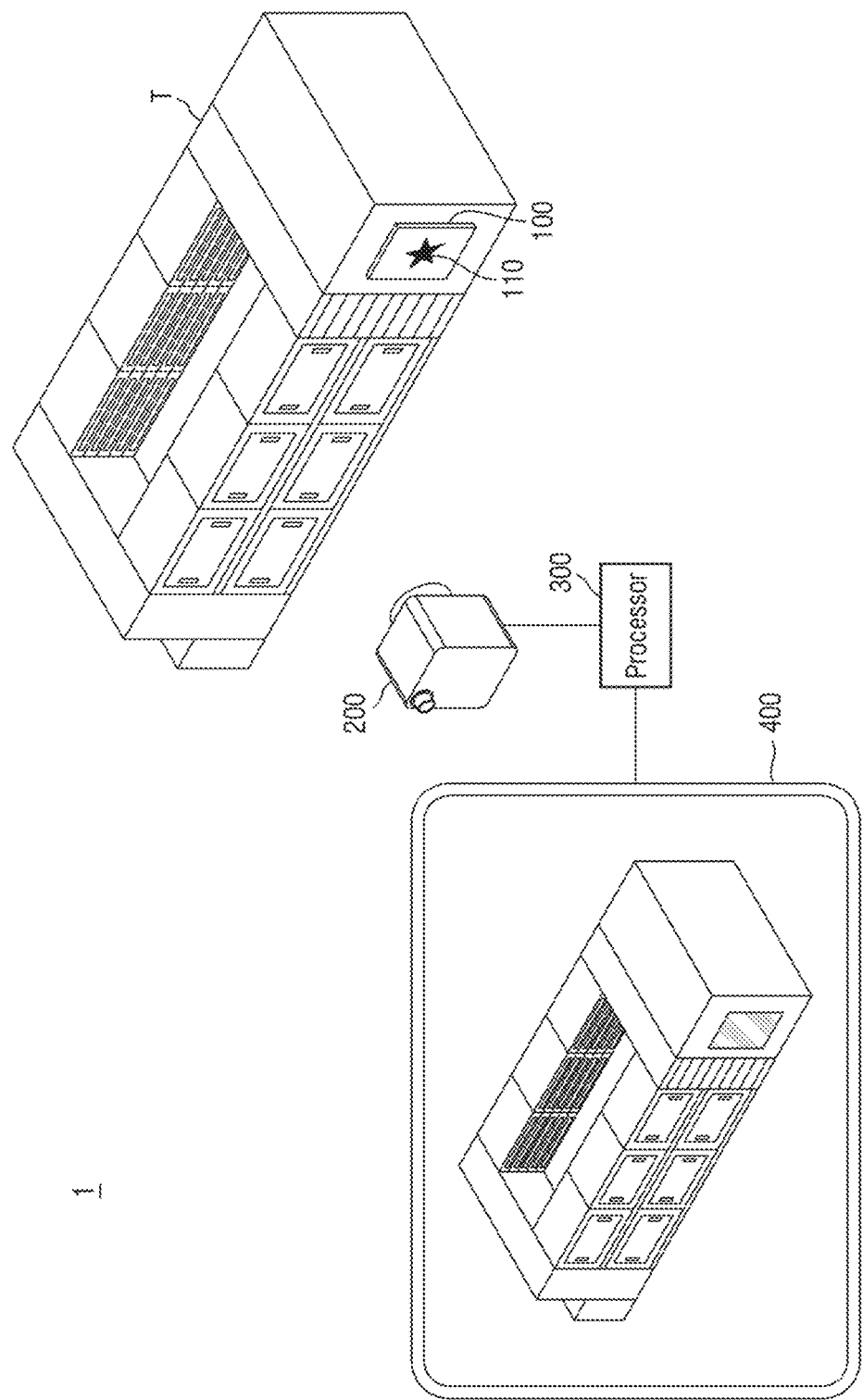
FIG. 1 is a conceptual diagram for describing a static electricity visualization system according to an embodiment of the present disclosure.

Hereinafter, preferred embodiments of the present disclosure will be described in detail with reference to the accompanying drawings. Advantages and features of the present disclosure and methods of achieving them will become apparent with reference to the embodiments described below in detail in conjunction with the accompanying drawings. However, the present disclosure is not limited to the embodiments described below, but may be implemented in various different forms, and these embodiments are provided only for making the description of the present disclosure complete and fully informing those skilled in the art to which the present disclosure pertains on the scope of the present disclosure, and the present disclosure is only defined by the scope of the claims. Like reference numerals refer to like elements throughout.

Referring to an element or layer "on" another element or layer comprises not only directly on the other element or layer, but also with intervening other layers or elements. On the other hand, referring to an element "directly on" or "directly on" indicates that no intervening element or layer is interposed.

Spatially relative terms "below," "beneath," "lower," "above," and "upper" can be used to easily describe a correlation between an element or components and other elements or components. The spatially relative terms should be understood as terms comprising different orientations of the device during use or operation in addition to the orientation shown in the drawings. For example, when an element shown in the figures is turned over, an element described as "below" or "beneath" another element may be placed "above" the other element. Accordingly, the exemplary term "below" may comprise both directions below and above. The device may also be oriented in other orientations, and thus spatially relative terms may be interpreted according to orientation.

Although first, second, etc. are used to describe various elements, components, and/or sections, it should be understood that these elements, components, and/or sections are not limited by these terms. These terms are only used to distinguish one element, component, or section from another element, component, or section. Accordingly, the first element, the first component, or the first section mentioned below may be the second element, the second component, or the second section within the technical spirit of the present disclosure.

The terminology used herein is for the purpose of describing the embodiments and is not intended to limit the present disclosure. In the present disclosure, the singular also comprises the plural, unless specifically stated otherwise in the phrase. As used herein, "comprises" and/or "comprising" refers to that components, steps, operations and/or elements mentioned does not exclude the presence or addition of one or more other components, steps, operations and/or elements.

Unless otherwise defined, all terms (comprising technical and scientific terms) used herein may be used with the meaning commonly understood by those of ordinary skill in the art to which the present disclosure belongs. In addition, terms defined in a commonly used dictionary are not to be interpreted ideally or excessively unless clearly specifically defined.

Hereinafter, embodiments of the present disclosure will be described in detail with reference to the accompanying drawings. In the description with reference to the accompanying drawings, the same or corresponding components are assigned the same reference numerals regardless of reference numerals, and overlapping descriptions thereof will be omitted.

FIG. 1 is a conceptual diagram for describing a static electricity visualization system according to an embodiment of the present disclosure.

Referring to FIG. 1, the static electricity visualization system 1 according to an embodiment comprises a measuring unit 100, a mark 110, a photographing unit 200, a processor 300, and an output unit 400.

The measuring unit 100 may be installed on the measurement target T. The measuring unit 100 may be disposed on the surface of the measurement target T. One or a plurality of measuring units 100 may be installed on the measurement target T.

The measuring unit 100 may measure the level of static electricity detected at a position installed on the surface of the measurement target T. In FIG. 1, the measurement target T is illustrated as an apparatus for processing a substrate, but the embodiment is not limited thereto. For example, the measurement target T, on which the measuring unit 100 is installed, may comprise other industrial equipment other than the substrate processing apparatus.

The measuring unit 100 may comprise a static electricity sensor to measure the static electricity level of the measurement target T. The static electricity sensor may measure the static electricity level of a single point or a single area of the measurement target T. The type of the static electricity sensor is not limited, and may comprise any static electricity sensor that is currently commercialized or may be commercialized according to the development of technology in the future.

The measuring unit 100 may comprise one or more static electricity sensors. When the measuring unit 100 comprises one static electricity sensor, each color displayed in the visualization image output by the output unit 400 may be displayed as one dot.

When one measuring unit 100 comprises a plurality of static electricity sensors, each color displayed in the visualization image output by the output unit 400 may appear as a region.

The measuring unit 100 may comprise a display unit that outputs the measured level of static electricity. Specifically, the measuring unit 100 may output the level of static electricity measured at the installed position as a numerical value through the display unit comprised in the measuring unit 100.

The measuring unit 100 may transmit data regarding the measured level of static electricity to the processor 300. In some embodiments, the measuring unit 100 may transmit data regarding the measured level of static electricity to the processor 300 through wireless communication. For example, the measuring unit 100 may transmit data regarding the measured level of static electricity to the processor 300 through Bluetooth.

The measuring unit 100 may comprise a mark 110. Specifically, the mark 110 may be attached to the surface of the measuring unit 100. The mark 110 may be recognized by the photographing unit 200 to indicate the position of the measuring unit 100.

The mark 110 may be detachably attached to the measuring unit 100. According to an embodiment, the measuring unit 100, to which the mark 110 is attached, and the measuring unit 100, to which the mark 110 is not attached, may be installed on the measurement target T. Since the measuring unit 100, to which the mark 110 is not attached, is not recognized by the photographing unit 200, the level of static electricity measured by the measuring unit 100, to which the mark 110 is not attached, may not be visually indicated in the image output by the output unit 400. In this case, the measuring unit 100, to which the mark 110 is not attached, may output the directly measured level of static electricity as a numerical value in the display unit comprised in the measuring unit 100.

In FIG. 1, the mark 110 is illustrated as having a star shape, but the embodiment is not limited thereto. The shape of the mark 110 may be variously modified according to the embodiment. For example, the mark 110 may have a rectangular or circular shape.

The photographing unit 200 may photograph the measurement target T. Specifically, the photographing unit 200 may photograph the measurement target T, on which the measuring unit 100 is installed.

The photographing unit 200 may transmit an image of photographing the measurement target T to the processor 300. When the size of the photographed image data transmitted by the photographing unit 200 to the processor 300 is large, the photographing unit 200 may transmit the image of photographing the measurement target T to the processor 300 through wired communication.

The processor 300 may generate a visualization image visually indicating the level of static electricity measured by the measuring unit 100.

The processor 300 may receive data of the static electricity level measured by the measuring unit 100 from the measuring unit 100. The processor 300 may receive an image obtained by the photographing unit 200 photographing the measurement target T from the photographing unit 200.

The processor 300 may recognize the mark 110 comprised in the image provided from the photographing unit 200. For example, the processor 300 may comprise a hardware accelerator implementing an algorithm for recognizing the mark 110, and the processor 300 may recognize the mark 110 through the corresponding algorithm.

The processor 300 may calculate the coordinates of the recognized mark 110 in the image provided from the photographing unit 200. The coordinates of the mark 110 calculated by the processor 300 may indicate the position of the measuring unit 100, to which the corresponding mark 110 is attached.

The processor 300 may set the mode of the output unit 400. Specifically, the processor 300 may control to change the image output by the output unit 400 by switching the first mode and the second mode of the output unit 400.

The processor 300 may determine a color displayed in the visualization image by using the level of static electricity provided from the measuring unit 100. Specifically, the processor 300 may generate a visualization image by determining a color corresponding to the level of static electricity measured by the measuring unit 100 and displaying the determined color on the photographed image provided from the photographing unit 200. This will be described in detail with reference to FIGS. 2 to 4 below.

The output unit 400 may output a visualization image provided from the processor 300. The output unit 400 may change an image to be output according to a mode set by the processor 300. This will be described in detail below with reference to FIGS. 5 to 7.

Figure 2:
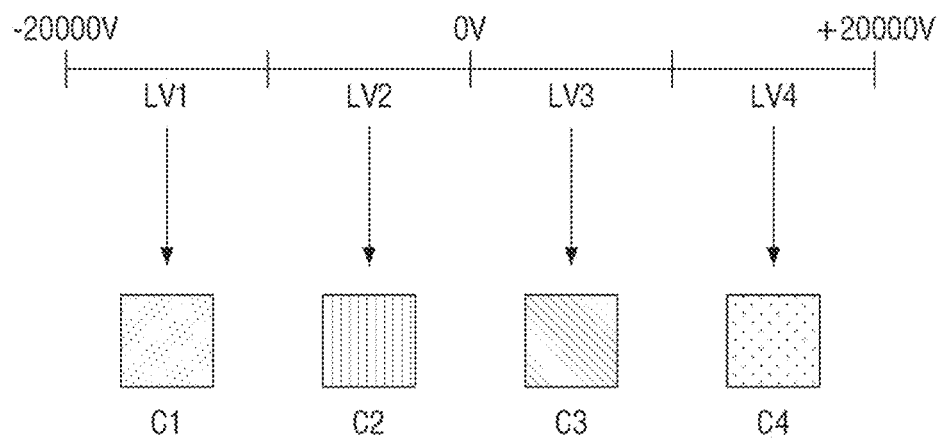
FIGS. 2 to 4 are diagrams for describing a static electricity visualization system according to an embodiment of the present disclosure.
Figure 3:
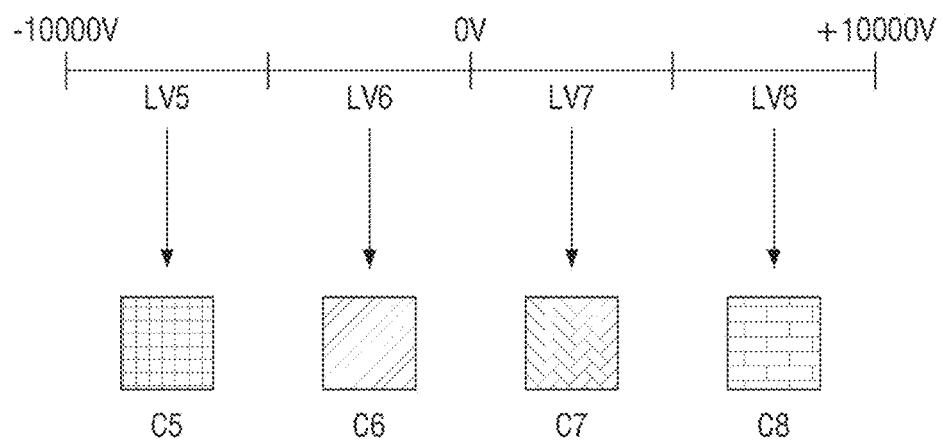
Figure 4:
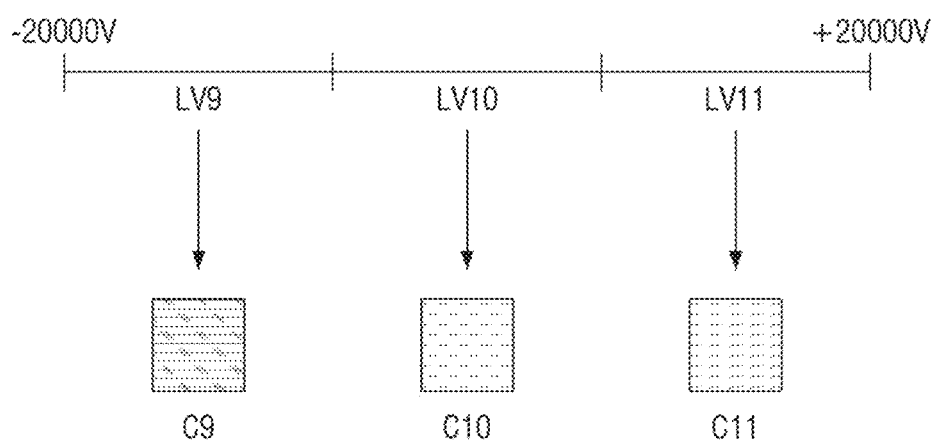

FIGS. 2 to 4 are diagrams for describing a static electricity visualization system according to an embodiment of the present disclosure.

Referring to FIGS. 2 to 4, the color chart may comprise a color corresponding to the level of static electricity measured by the measuring unit 100. That is, the processor 300 may determine a color corresponding to the level of static electricity provided from the measuring unit 100 according to the color chart, and display the determined color on the visualization image output from the output unit 400.

For example, referring to FIG. 2, when the total range of the static electricity level measured by the measuring unit 100 is −20000V to +20000V, and when the total range of the static electricity level is divided into four level sections, the first color chart can match the level of static electricity and the color Accordingly, when the processor 300 determines a color comprised in the visualization image according to the first color chart, and when the level of static electricity measured by the measuring unit 100 corresponds to the first level LV1 of the first color chart, the processor 300 may display the first color C1 on the coordinates of the mark 110 comprised in the corresponding measuring unit 100 in the photographed image provided from the photographing unit 200. When the level of static electricity measured by the measuring unit 100 corresponds to the second level LV2 of the first color chart, the processor 300 may display the second color C2 on the coordinates of the mark 110 comprised in the corresponding measuring unit 100 in the photographed image provided from the photographing unit 200.

Similarly, when the levels of static electricity measured at different positions by the two measuring units 100 correspond to the third level LV3 and the fourth level LV4 of the first color chart, the processor 300 may display the third color C3 and the fourth color C4 on the coordinates of the mark 110 comprised in the corresponding measuring unit 100, respectively, in the photographed image provided from the photographing unit 200.

For another example, referring to FIG. 3, when the total range of the static electricity level measured by the measuring unit 100 is −10000V to +10000V, and when the total range of the static electricity level is divided into four level sections, the second color chart can match the level of static electricity and the color.

Accordingly, when the processor 300 determines a color comprised in the visualization image according to the second color chart, and when the level of static electricity measured by the measuring unit 100 corresponds to the fifth level LV5 of the second color chart, the processor 300 may display the fifth color C5 on the coordinates of the mark 110 comprised in the corresponding measuring unit 100 in the photographed image provided from the photographing unit 200. When the level of static electricity measured by the measuring unit 100 corresponds to the sixth level LV6 of the second color chart, the processor 300 may display the sixth color C6 on the coordinates of the mark 110 comprised in the corresponding measuring unit 100 in the photographed image provided from the photographing unit 200.

Similarly, when the levels of static electricity measured at different positions by the two measuring units 100 correspond to the seventh level LV7 and the eighth level LV8 of the second color chart, the processor 300 may display the seventh color C7 and the eighth color C8 on the coordinates of the mark 110 comprised in the corresponding measuring unit 100, respectively, in the photographed image provided from the photographing unit 200.

For another example, referring to FIG. 4, when the total range of the static electricity level measured by the measuring unit 100 is −20000V to +20000V, and when the total range of the static electricity level is divided into three level sections, the third color chart can match the level of static electricity and the color.

Accordingly, when the processor 300 determines a color comprised in the visualization image according to the third color chart, and when the level of static electricity measured by the measuring unit 100 corresponds to the first level LV1 of the third color chart, the processor 300 may display the ninth color C9 on the coordinates of the mark 110 comprised in the corresponding measuring unit 100 in the photographed image provided from the photographing unit 200. When the level of static electricity measured by the measuring unit 100 corresponds to the second level LV2 of the third color chart, the processor 300 may display the tenth color C10 on the coordinates of the mark 110 comprised in the corresponding measuring unit 100 in the photographed image provided from the photographing unit 200.

Although FIGS. 2 to 4 show a case, in which the total range of the static electricity level measured by the measuring unit 100 is divided into four or three level sections, the embodiment is not limited thereto. According to the total range of the static electricity measured by the measuring unit 100, the number of sections dividing the total range of the static electricity level may vary according to exemplary embodiments.

As the number of sections dividing the total range of the static electricity level increases, the number of colors corresponding to each section increases. Therefore, the distribution of static electricity levels can be confirmed in detail through the visualization image.

Figure 5:
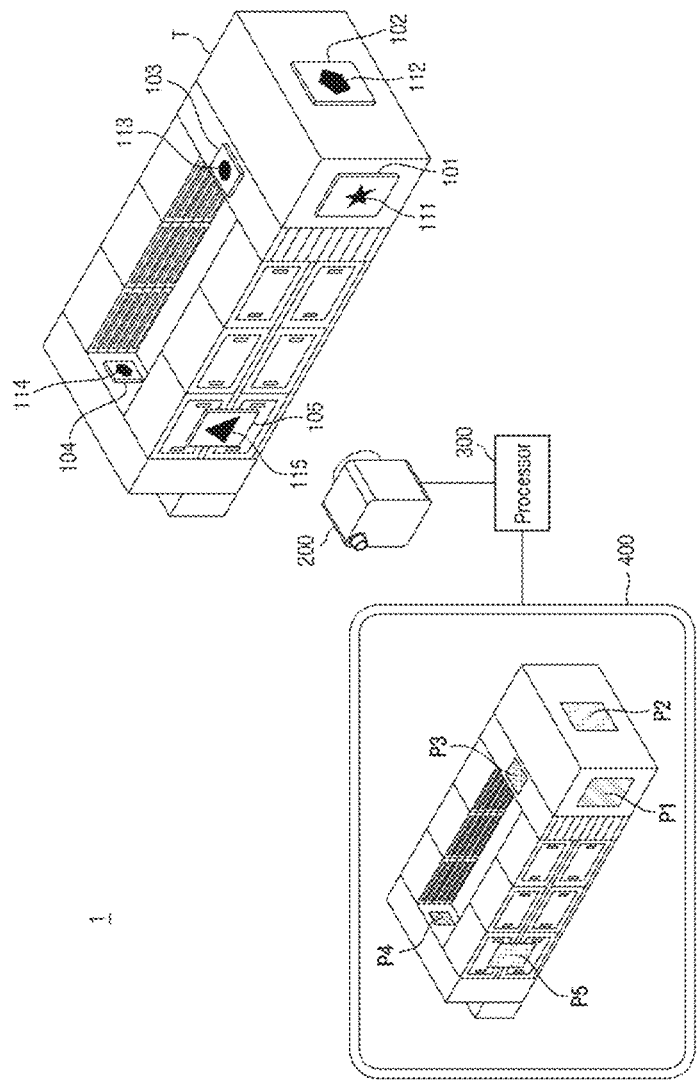
FIGS. 5 and 6 are diagrams for describing the operation of the static electricity visualization system according to an embodiment of the present disclosure.
Figure 6:
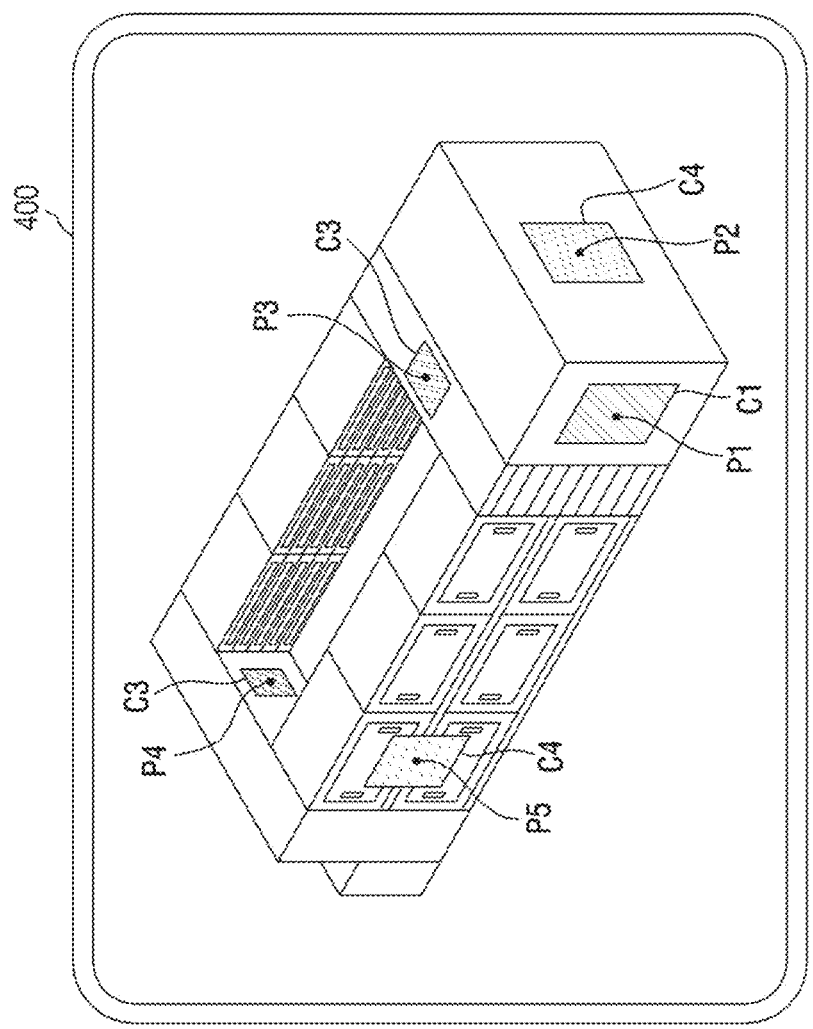

FIGS. 5 and 6 are diagrams for describing the operation of the static electricity visualization system according to an embodiment of the present disclosure.

Referring to FIGS. 5 and 6, according to the level of static electricity measured by the first to fifth measuring units 101 to 105, the color displayed on the image of the measurement target T output by the output unit 400 may vary.

The first to fifth marks 111-115 attached to the first to fifth measuring units 101-105 installed at different positions of the measurement target T may have different shapes, respectively. For example, the first mark 111 may have a star shape, and the second mark 112 may have a circular shape. Likewise, the third to fifth marks 113 to 115 may all have different shapes.

The first to fifth marks 111 to 115 attached to the first to fifth measuring units 101 to 105 have different shapes, respectively, so that the processor 300 recognizes the first to fifth marks 111-115, and calculates the coordinates of the first to fifth marks 111-115, respectively. Accordingly, the positions of the first to fifth measuring units 101-105 that are different from each other can be calculated.

The processor 300 may control the output unit 400 to output the visualization image generated by the processor 300 by switching the mode of the output unit 400 to the first mode. In addition, the processor 300 may select the first color chart to determine a color corresponding to the level of static electricity provided from the measuring unit 100.

Since the level of static electricity measured by the first measuring unit 101 corresponds to the first level LV1, the processor 300 can determine the first color C1 appearing at the first position P1, which is the coordinates of the first mark 111 in the photographed image provided from the photographing unit 200. Accordingly, the output unit 400 may output a visualization image, in which the first color C1 is displayed at the first position P1.

Since the level of static electricity measured by the second measuring unit 102 corresponds to the fourth level LV4, the processor 300 can determine the fourth color C4 appearing at the second position P2, which is the coordinates of the second mark 112 in the photographed image provided from the photographing unit 200. Accordingly, the output unit 400 may output a visualization image, in which the fourth color C4 is displayed at the second position P2.

Since the level of the static electricity measured by the third measuring unit 103 corresponds to the third level LV3, the processor 300 can determine the third color C3 appearing at the third position P3, which is the coordinates of the third mark 113 in the photographed image provided from the photographing unit 200. Accordingly, the output unit 400 may output a visualization image, in which the third color C3 is displayed at the third position P3.

Since the level of static electricity measured by the fourth measuring unit 104 corresponds to the third level LV3, the processor 300 can determine the third color C3 appearing at the fourth position P4, which is the coordinates of the fourth mark 114 in the photographed image provided from the photographing unit 200. Accordingly, the output unit 400 can output a visualization image, in which the third color C3 is displayed at the fourth position P4. That is, even if the third measuring unit 103 and the fourth measuring unit 104 are installed in different positions on the measurement target T, if the levels of static electricity measured at each position by the third measuring unit 103 and the fourth measuring unit 104 are the same, the output unit 400 may output the positions where the third measuring unit 103 and the fourth measuring unit 104 are installed with the same color in the visualization image.

Since the level of the static electricity measured by the fifth measuring unit 105 corresponds to the fourth level LV4, the processor 300 can determines the fourth color C4 appearing at the fifth position P5, which is the coordinates of the fifth mark 115 in the photographed image provided from the photographing unit 200. Accordingly, the output unit 400 may output a visualization image, in which the fourth color C4 is displayed at the fifth position P5. That is, even if the positions where the second measuring unit 102 and the fifth measuring unit 105 are installed on the measurement target T are different, if the level of the static electricity measured at each position by the second measuring unit 102 and the fifth measuring unit 105 is the same, the output unit 400 may output the position where the second measuring unit 102 and the fourth measuring unit 105 are installed with the same color in the visualization image.

As described with reference to FIGS. 5 and 6, in the image obtained by photographing the measurement target T whose level of static electricity is measured through the measuring unit 100, by displaying different colors according to the level of static electricity, it is possible to detect at what level static electricity is emitted for each position of the measurement target T.

Figure 7:
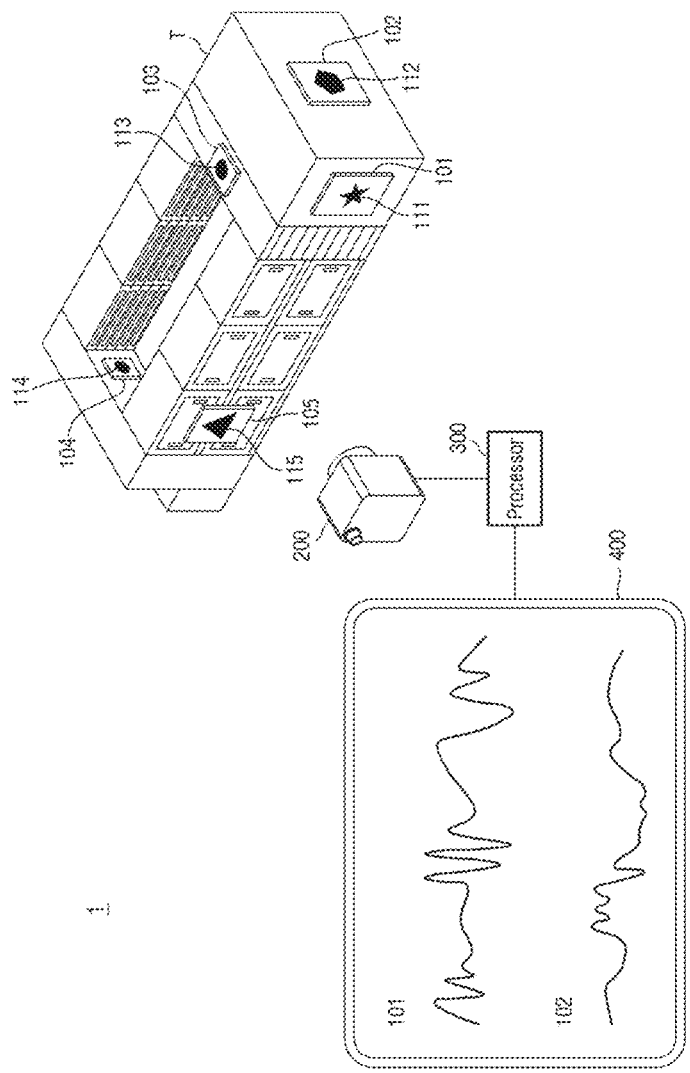
FIG. 7 is a view for describing the operation of the static electricity visualization system according to an embodiment of the present disclosure.

FIG. 7 is a view for describing the operation of the static electricity visualization system according to an embodiment of the present disclosure. For convenience of description, the points different from those described with reference to FIGS. 5 and 6 will be mainly described.

Referring to FIG. 7, the output unit 400 does not output a photographed image obtained by the photographing unit 200 photographing the measurement target T, may output a graph of changes in the static electricity level measured by each measuring unit 100 for a predetermined time.

By switching the mode of the output unit 400 to the second mode, the processor 300 may control the output unit 400 to output a graph of changes in the static electricity level over time measured by the measuring unit 100.

In the second mode, the output unit 400 may output a change in the level of the static electricity measured by the first measuring unit 101 at the first position as a graph. The user may observe a change in the static electricity level at the first position of the measurement target T, in which the first measuring unit 101 is installed, through the graph output by the output unit 400 in the second mode.

Similarly, the output unit 400 may output the change in the static electricity level measured by the second measuring unit 102 at the second position as a graph.

In FIG. 7, although it is illustrated that the output unit 400 outputs only the graph of the amount of change in the static electricity level measured by the first measuring unit 101 and the second measuring unit 102, but the embodiment is not limited thereto. For example, the output unit 400 may output only a graph of a change in the static electricity level measured by the first measuring unit 101. The measuring unit 100 measuring the static electricity level indicated by the graph output by the output unit 400 may be selected by the user. In addition, according to a user's selection, the output unit 400 may output a graph of changes in the static electricity level measured by all the measuring units 100 installed on the measurement target T at once.

Figure 8:
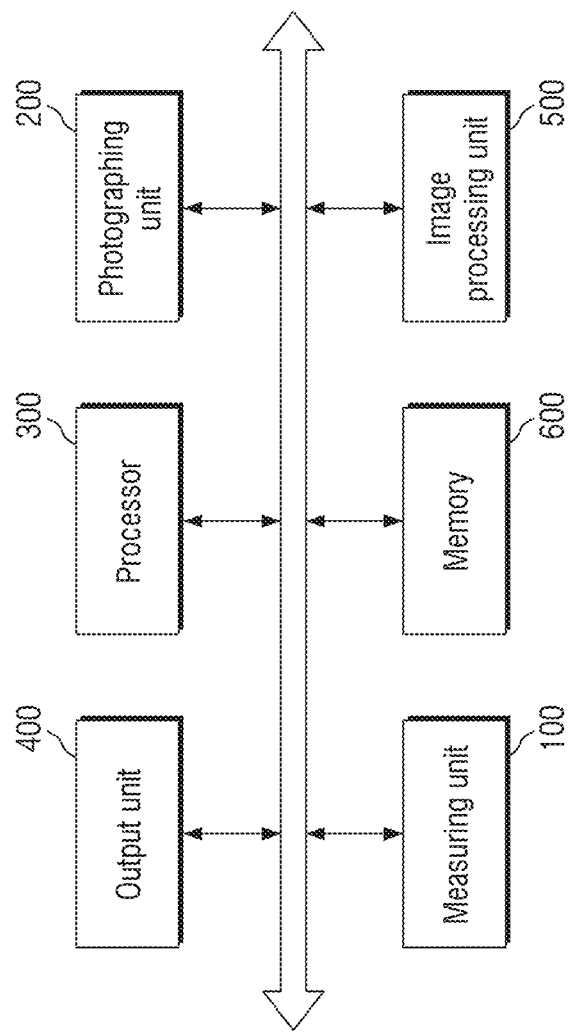
FIG. 8 is a view for describing a static electricity visualization system according to an embodiment of the present disclosure.

FIG. 8 is a view for describing a static electricity visualization system according to an embodiment of the present disclosure. For convenience of description, the points different from those described with reference to FIG. 1 will be mainly described.

The static electricity visualization system 1 may comprise a measuring unit 100, a photographing unit 200, a processor 300, an output unit 400, an image processing unit 500, and a memory 600.

The measuring unit 100, the photographing unit 200, the processor 300, and the output unit 400 are the same as the measuring unit 100, the photographing unit 200, the processor 300, and the output unit 400 as described above with reference to FIGS. 1 to 4.

The image processing unit 500 may perform pre-processing on the photographed image obtained by the photographing unit 200 photographing the measurement target T. The image processing unit 500 performs pre-processing on the photographed image obtained by the photographing unit 200 photographing the measurement target T, thereby making it easier for the processor 300 to generate a visualization image using the photographed image, and calculate the coordinates of the mark. For example, the image processing unit 500 may correct or improve optical characteristics by performing corrections such as white balance and color adjustment of the first photographed image of the photographing unit 200.

The memory 600 may store the level of static electricity measured by the measuring unit 100. Also, the memory 600 may store a color chart used by the processor 300. In this case, the processor 300 may receive the color chart stored in the memory 600 and determine a color corresponding to the level of static electricity measured by the measuring unit 100.

The memory 600 may comprise a volatile memory or a non-volatile memory according to an embodiment. By storing data used or calculated by the static electricity visualization system 1 in the memory 600, the data stored in the memory 600 may be provided according to a user's request.

Accordingly, the user can effectively control static electricity by using static electricity level data stored in the memory 600.

In FIG. 8, the processor 300 and the image processing unit 500 are respectively indicated by different blocks, but the embodiment is not limited thereto. For example, the processor 300 may comprise the image processing unit 500.

Although embodiments of the present disclosure have been described with reference to the above and the accompanying drawings, those of ordinary skill in the art to which the present disclosure pertains can understand that the present disclosure can be practiced in other specific forms without changing its technical spirit or essential features. Therefore, it should be understood that the embodiments described above are illustrative in all respects and not restrictive.

What is claimed is:

1. A static electricity visualization system comprising:
   a first sensor configured to measure a static electricity level detected at a first position of a measurement target and comprising a first mark;
   a second sensor configured to measure a static electricity level detected at a second position of the measurement target, and comprising a second mark, wherein the second mark has a different shape from the first mark;
   a photographing unit configured to generate a photographed image by photographing the measurement target;
   a processor configured to recognize the first mark and the second mark in the photographed image and calculating coordinates of the first mark and the second mark on the photographed image; and
   an output unit for outputting a static electricity visualization image that visualizes the static electricity level measured by the first sensor in a first mode,
   wherein the static electricity visualization image comprises a color corresponding to the static electricity level measured by the first sensor on the coordinates of the first mark of the photographed image,
   wherein the processor is configured to:
   receive the photographed image from the photographing unit, and receive the measured static electricity level from the first sensor, and
   generate the static electricity visualization image, in which the color corresponding to the static electricity level measured by the first sensor is displayed on the coordinates of the first mark of the photographed image,
   wherein the output unit is configured to, in a second mode, output a change in the static electricity level measured by the first sensor for a predetermined time as a graph,
   wherein the first sensor is configured to transmit data of the measured static electricity level to the processor through wireless communication, and
   wherein the first sensor is configured to be detachable from the first position of the measurement target.

2. The system of claim 1, further comprising
   a memory configured to store color data corresponding to the static electricity level measured by the first sensor,
   wherein the processor is configured to generate the static electricity visualization image by using the color data stored in the memory.

3. The system of claim 1, wherein the processor is configured to switch the first mode and the second mode of the output unit.

4. The system of claim 1, wherein the first sensor is configured to output the measured static electricity level as a numerical value.

5. A static electricity visualization system comprising:
   a first sensor installed at a first position of a measurement target for measuring a level of static electricity detected at the first position, and to which a first mark is attached;
   a second sensor installed at a second position of a measurement target for measuring a level of static electricity detected at the second position, and to which a second mark is attached, wherein the second mark has a different shape from the first mark;
   a photographing unit configured to photograph the measurement target, on which the first sensor is installed;
   a processor configured to calculate coordinates of the first mark and the second mark on a photographed image of photographing the measurement target, and generate a visualization image, in which a first color corresponding to the level of static electricity measured by the first sensor is displayed on coordinates of the first mark; and
   an output unit configured to output the visualization image generated by the processor in a first mode,
   wherein the processor is configured to receive a photographed image of photographing the measurement target from the photographing unit, and receive the level of static electricity measured at the first position from the first sensor through wireless communication,
   wherein the output unit is configured to, in a second mode, output a change in the level of the static electricity measured by the first sensor for a predetermined time as a graph,
   wherein the first sensor is configured to transmit data of the measured static electricity level to the processor through the wireless communication, and
   wherein the first sensor is configured to be detachable from the first position of the measurement target.

6. The system of claim 5,
   wherein the visualization image displays a second color corresponding to the level of static electricity measured by the second sensor different from the level of static electricity measured by the first sensor on coordinates of the second mark,
   wherein the first color and the second color are different.

7. The system of claim 5, wherein the first sensor comprises a display unit configured to output the level of static electricity measured at the first position as a numerical value.

8. The system of claim 5, further comprising a memory for storing static electricity level data measured by the first sensor.

9. The system of claim 5, further comprising
   a memory configured to store a plurality of color charts comprising color data corresponding to the level of static electricity measured by the first sensor,
   wherein the processor is configured to select one color chart from among the plurality of color charts stored in the memory,
   wherein the processor is configured to match the level of static electricity measured by the first sensor and the first color corresponding thereto in the one color chart, and display the first color on coordinates of the first mark.

10. The system of claim 5, wherein the processor is configured to, according to an external request, switch the first mode and the second mode of the output unit.

11. A static electricity visualization system comprising:
a first sensor installed at a first position of a measurement target for measuring a level of static electricity detected at the first position, and to which a first mark is attached;
a second sensor installed at a second position of a measurement target for measuring a level of static electricity detected at the second position, and to which a second mark is attached, wherein the second mark has a different shape from the first mark;
a photographing unit for photographing the measurement target, on which the first sensor is installed;
a memory configured to store a plurality of color charts comprising color data corresponding to a level of static electricity;
a processor configured to generate a visualization image, in which a first color corresponding to the level of static electricity measured by the first sensor is displayed on coordinates of the first mark; and
an output unit configured to output the visualization image generated by the processor in a first mode,
wherein the processor is configured to receive a photographed image of photographing the measurement target from the photographing unit, and receive the level of static electricity measured at the first position from the first sensor through wireless communication,
wherein the processor is configured to calculate coordinates of the first mark on the photographed image, and select one color chart from among a plurality of color charts stored in the memory,
wherein the processor is configured to determine, in the selected one color chart, a color corresponding to the level of static electricity measured by the first sensor,
wherein the processor is configured to generate the visualization image by displaying the determined color on the coordinates of the first mark,
wherein the output unit is configured to, in response to the processor switching the output unit to a second mode, output a change in the level of static electricity measured by the first sensor for a predetermined time as a graph,
wherein the first sensor is configured to transmit data of the level of static electricity measured by the first sensor to the processor through the wireless communication, and
wherein the first sensor is configured to be detachable from the first position of the measurement target.

* * * * *